(12) United States Patent
Page et al.

(10) Patent No.: US 12,347,914 B2
(45) Date of Patent: Jul. 1, 2025

(54) GIANT NONRECIPROCITY OF SURFACE ACOUSTIC WAVES ENABLED BY THE MAGNETOELASTIC INTERACTION

(71) Applicant: Government of the United States as represented by the Secretary of the Air Force, Wright-Patterson AFB, OH (US)

(72) Inventors: Michael R Page, Powell, OH (US); Piyush J Shah, West Chester, OH (US); Derek A Bas, Dayton, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 561 days.

(21) Appl. No.: 17/717,264

(22) Filed: Apr. 11, 2022

(65) Prior Publication Data

US 2022/0367998 A1    Nov. 17, 2022

Related U.S. Application Data

(60) Provisional application No. 63/180,895, filed on Apr. 28, 2021.

(51) Int. Cl.
*H01P 1/32* (2006.01)
*H03H 9/02* (2006.01)
(Continued)

(52) U.S. Cl.
CPC .......... *H01P 1/32* (2013.01); *H03H 9/02559* (2013.01); *H03H 9/145* (2013.01); *H03H 9/25* (2013.01)

(58) Field of Classification Search
CPC ............ H03H 9/145; H03H 9/25; H03H 9/22; H03H 9/14505; H03H 9/02559; H01P 1/32
See application file for complete search history.

(56) References Cited

U.S. PATENT DOCUMENTS 4,024,452 A      5/1977 Seidel
2019/0386642 A1*  12/2019 Komatsu ............ H03H 9/14541
(Continued)

OTHER PUBLICATIONS

R. Fleury et al., "Demonstration of efficient nonreciprocity in a microwave optomechanical circuit," Phys. Rev. X. vol. 7 (2017) 031001, 10 pages total.
(Continued)

*Primary Examiner* — Daniel Pihulic
(74) *Attorney, Agent, or Firm* — AFMCLO/JAZ; Eugene P. Sunday (57) ABSTRACT

A nonreciprocal microwave transmission device includes a substrate, a transducer on a surface of the substrate and configured to reciprocally convert between electrical signals to acoustic waves, a first piezoelectric material configured to generates and transports acoustic waves from a signal applied to the transducer, and a thin film magnetic material configured to couple to acoustic waves through magnetoelastic coupling so as to have non-reciprocal magnetoelastic coupled acoustic wave transport. Transmission of acoustic waves through the thin film magnetic material is in a direction toward the transducer has a first magnitude and transmission of acoustic waves through the thin film magnetic material in a direction away from the transducer has a second magnitude, the first and second magnitude being significantly different.

41 Claims, 6 Drawing Sheets

(51) Int. Cl.
   *H03H 9/145*   (2006.01)
   *H03H 9/25*    (2006.01)

(56) References Cited

U.S. PATENT DOCUMENTS

2022/0367998 A1* 11/2022 Page .................. H03H 9/145
2023/0336144 A1* 10/2023 Page .................. H01P 1/19

OTHER PUBLICATIONS

R. Fleury et al., "Sound isolation and giant linear nonreceiprocity in a compact acoustic circulator," Science. vol. 343 (2014) 516-519.
D. G. Haigh, "Wideband active microwave isolators using GaAs MMIC technology," IEEE Proc Microw. Anntennas Propag., vol. 143 (19962) 179-183.
D. G. Huff et al., "Optoelectronic isolator for microwave applications," IEEE Trans. Microw. Theory Techn., vol. 38 (1990) 571-576.
M. F. Lewis et al., "Acoustic-surface-wave isolator," Appl. Phys. Lett., vol. 20 (1972) 276-278.
R. Sasaki et al., "Nonreciprocal propagation of surface acoustic wave in Ni/LiNbO3," Phys. Rev. B, vol. 95 (2017) 020407, 5 pages total.
R. Verba et al., "Wide-band nonreceiprocity of surface acoustic waves induced by magnetoelastic coupling with a synthetic antiferromagnet," Phys. Rev. Appl., vol. 12 (2019) 054061, 8 pages total.
R. Verba et al., "Nonreciprocal surface acoustic waves in multilayers with mangetoelestic and interfacial Dzyaloshinskii-Moriya interactions," Phys. Rev. Appl., vol. 9 (2018) 064014, 11 pages total.

* cited by examiner

GIANT NONRECIPROCITY OF SURFACE ACOUSTIC WAVES ENABLED BY THE MAGNETOELASTIC INTERACTION

CROSS-REFERENCE TO RELATED APPLICATIONS

This application claims the benefit of priority under 35 U.S.C. § 119(e) to U.S. Provisional Application Ser. No. 63/180,895 entitled "Giant Nonreciprocity Of Surface Acoustic Waves Enabled by the Magnetoelastic Interaction", filed 28 Apr. 2021, the contents of which are incorporated herein by reference in their entirety.

RIGHTS OF THE GOVERNMENT

The invention described herein may be manufactured and used by or for the Government of the United States for all governmental purposes without the payment of any royalty.

FIELD OF THE INVENTION

The present invention relates generally to nonreciprocal microwave transmission devices.

BACKGROUND OF THE INVENTION

Nonreciprocal microwave transmission devices, such as isolators and circulators, have an important role in the front-end of most RF systems, as well as test and measurement equipment. These devices permit RF propagation in a first direction while limiting, resisting, or blocking propagation in a second direction (generally, the second direction opposes the first direction). From an application point-of-view, the transmission device should include low insertion loss (allow full transmission from a first port to a second port) and high isolation (block transmission from the second port to the first port). This type of device can be thought of as a diode for RF energy. Current state-of-the-art isolators and circulators utilize a transversely magnetized ferrite junction to direct the incoming microwave energy and allow travel in a direction of the magnetizing field.

In 1971, Lewis proposed an alternative form of acoustic isolator device concept using a layered SAW delay line with ZnO/YIG on GGG substrate. While acoustic isolator device concepts have been largely ignored for decades, these concepts are the subject of very recent theoretical investigations generating significant interest. In general, nonreciprocal propagation of surface acoustic waves (SAWs) is nontrivial to achieve and has been observed in nonmagnetic metal (aluminum) and some semiconductor heterostructures. However, the nonreciprocity magnitude is not sufficient for real-world application relevance. Spin wave nonreciprocity has been an active area of research interest resulting in numerous reports in the last decade. The theoretical framework that explains spin wave nonreciprocity is either based on frequency displacement in the ferromagnetic layer or i on interband magnonic transitions in a system with lack of time-reversal symmetry.

More recent investigation includes device physics utilizing magnetoelastic interactions of spin and acoustic waves. This is based on traveling SAWs coupling into the magnetostrictive ferromagnetic thin film in the SAW propagation path. The most common materials system studied on this subject is Ni on lithium niobate ($LiNbO_3$), which has been shown to have reciprocal transmission behavior due to polycrystallinity of the Ni film. This lead to a larger Gilbert damping coefficient that results in wider line widths in the magnetization response. Several device concepts, such as magnetically tunable phase shifters and resonators, were reported in the 1970s that utilized magnetoelastic interactions. The recent resurgence of study in magnetoelastic interactions utilizing SAWs is being termed as acoustically driven ferromagnetic resonance (ADFMR).

SAW-based frequency filters, delay lines, and sensors are mature technologies and have several applications in the RF frequency (low MHz up to 2.5 GHz) regime. Ultra low loss, temperature compensated SAW filters are essential elements in military and consumer communication devices such as cell phones and tablets. Acoustic transmission is advantageous because the propagation speeds and wavelengths are typically several orders of magnitude lower than for electromagnetic waves and therefore scaling down is easily achieved.

Yet, there remains a strong need for a microfabricated miniature tunable-band isolator/circulator that has an ability to operate at frequencies from 1000 MHz to 100 GHz.

SUMMARY OF THE INVENTION

The present invention overcomes the foregoing problems and other shortcomings, drawbacks, and challenges of providing a microfabricated miniature tunable-band isolator/circulator that has an ability to operate at frequencies from 1000 MHz to 100 GHz. While the invention will be described in connection with certain embodiments, it will be understood that the invention is not limited to these embodiments. To the contrary, this invention includes all alternatives, modifications, and equivalents as may be included within the spirit and scope of the present invention.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Figure 1:
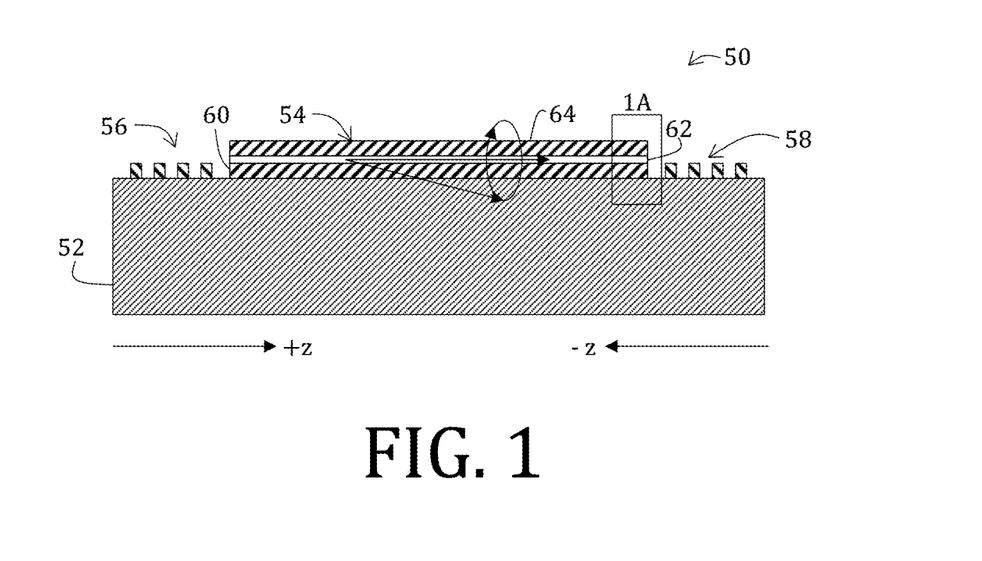
FIG. 1 show is a split-finger IDT (interdigitial transducer) design.

Referring now to FIG. 1, a device 50 according to an embodiment of the present invention is shown. The physical mechanism of the proposed isolator is based on the coupling between acoustic waves in LiNbO$_3$ substrate 52 and spin waves in an adjacent multilayer magnetic film 54. The configuration of the multilayer film 54 allows for a strongly nonreciprocal dispersion law of spin waves, while ADFMR (acoustically driven ferromagnetic resonance) effectively attenuates acoustic waves in one direction and practically does not affect their propagation in the opposite direction. The combination of these two features leads to a much better achievable isolation compared to typical single-layered ADFMR isolators The device 50 of FIG. 1 is a split-finger IDT (interdigitial transducer) design, generating Rayleigh waves using single crystal y-cut LiNbO$_3$ substrate. Favorable SAW propagation is along the z-axis between the input IDT 56 and the output IDT 58 for the delay line filter geometry. The split-finger design minimizes the destructive interference caused by reflection from the IDTs 56, 58 and thereby allows the device to operate at higher odd harmonics of the fundamental frequency. The nominal designed fundamental frequency f$_1$ is around 291 MHz, however, most of the reported measurements are at higher harmonic f$_3$, f$_5$, and f$_7$=873, 1455 and 2037 MHz, respectively. The IDTs 56, 58 have 60 finger pairs with the minimum electrode separation $\lambda/8=1.5$ μm. The delay line spacing between the IDT pairs is 3 mm. IDT patterning for metal-liftoff was completed using negative tone lift-off photoresist NR9-1000Py and a Karl Suss MA6 mask aligner contact lithography system. The Al electrode thickness is 70 nm, deposited using e-beam evaporation. Details on the SAW device design, fabrication and its impact on ADFMR performance are discussed in D. A. BAS et al., "Optimization of acoustically-driven ferromagnetic resonance devices," *J. Appl. Phys.*, Vol. 126 (2019) 114501.

Figure 1A:
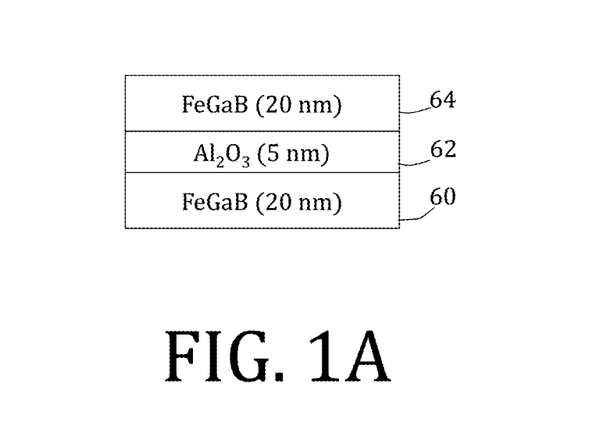
FIG. 1A shows a multilayer thin-film stack.
Figure 2:
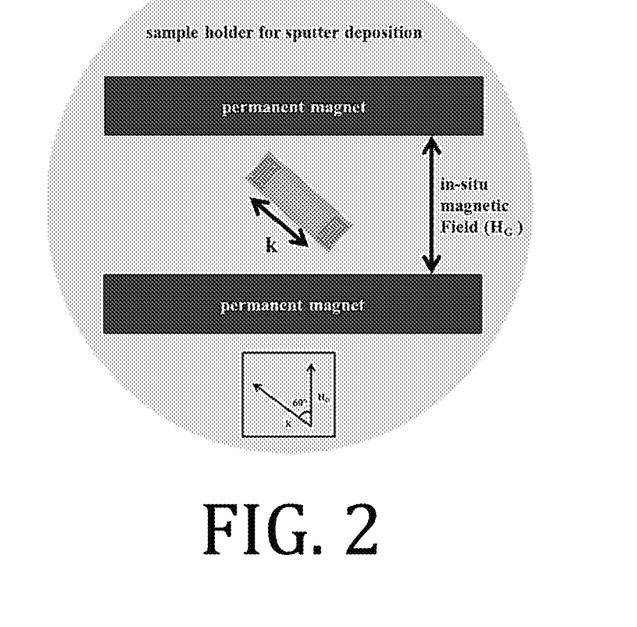
FIG. 2 is a schematic figure of in-situ magnetic field orientation with respect to the SAW k-vector.

The multilayer thin-film stack 54 is positioned in a space between the IDTs 56, 58. The stack 54, shown in better detail in FIG. 1A, includes thin-film stacks of FeGaB 60, Al$_2$O$_3$ 62, and FeGaB 64, which may be deposited via sputtering and lithographically patterned with width 500 μm along x and length 2200 μm along z. The film stack 54 is deposited in the presence of external magnetic field. A schematic figure of in-situ magnetic field orientation with respect to the SAW k-vector is shown in FIG. 2.

While not wishing to be bound by theory, a dynamic theory that is applicable for any mono-domain magnetic ground state of a magnetic bilayer is describe here. Of particular interest is a case where ferromagnetic layers are oriented in an antiparallel fashion and the uniaxial magnetic anisotropy axes are collinear in both layers. In the absence of an external magnetic field the magnetization vectors are naturally oriented in opposite directions, while an external magnetic field tilts the magnetization vectors creating a canted ground state. Calculations of the static magnetic states in such a system is quite cumbersome, but well known in literature. For simplicity, the films are presumed to be composed of identical magnetic material and have identical thickness L. The layers are separated by a nonmagnetic spacer with thickness d$_s$. The layers are also presumed to be sufficiently thin (L<<λ) with respect to spin wave wavelength λ.

Magnetic dynamics in each layer are governed by Landau-Lifshitz equations:

$$\frac{dM_i(t)}{dt} = \gamma B_i^{eff}(t, M_1, M_2) \times M_i(t), \quad \text{Equation 1}$$

where i=1,2 is the layer index, $\gamma/(2\pi) \approx 28$ GHz/T is the gyromagnetic ratio, M$_i$ is the magnetization in each layer and B$_i^{eff}$ is the effective magnetic field acting on the i-th layer. For the sake of simplicity in the following derivation, magnetization is presumed to be uniform across a layer, but can be different in each layer.

Considering small amplitude dynamics, the magnetization may be decomposed into static and dynamic parts as: $M_i(t) = M_s(\mu_i + s_i e^{-i\omega t})$, where |μ|=1 is the vector pointing in the direction of the equilibrium magnetization, s$_i$ is the spin-excitation vector, and ω is the angular frequency of the spin-wave. By definition these vectors are orthogonal to each other: $\mu_i \cdot s_i = 0$. This expansion enables linearization of Equation 1.

Assuming the lateral dimensions of the films are much larger than the distance between them, we can neglect the static part of the interaction between layers. Under this approximation we can find the equilibrium magnetization and the internal magnetic field B$_i$ as:

$$B_i \mu_i = B^{ext} - \mu_0 M_s (\hat{N}_0 + \hat{K}) \cdot \mu_i \quad \text{Equation 2}$$

where $\hat{N}_0$ and $\hat{K}$ are the tensors of static demagnetization and uniaxial anisotropy.

The dynamic part of Equation 1 can be written as:

$$-i\omega_k^{sw} s_i = \mu_i \times [\hat{\Omega}_k \cdot s_i + \omega_M \hat{R}_k^{i,j} \cdot s_j] \quad \text{Equation 3}$$

where $\hat{\Omega}_k = [\gamma B_i \hat{I} + \omega_M(\hat{N}_k + \hat{K} + \lambda_{ex}^2 k^2 \hat{I})]$ is the dynamic self-interaction tensor, $\hat{N}_k$ is the dynamic self-demagnetization tensor, $\hat{I}$ is an identity matrix, $\hat{R}_k^{i,j}$ is the mutual cross-demagnetization tensor which defines the dynamic interaction between the films, $\lambda_{ex}$ is the inhomogeneous exchange length, j≠i, $\omega_M = \gamma \mu_0 M_s$, and k is the wave vector of the spin wave. Wave vector dependence is implied for s$_i$, although the index is dropped.

Equation 3 may be rewritten in a more compact form of a standard eigenvalue problem:

$$-i\omega_k^{sw}\begin{pmatrix}\hat{J}_1 & 0 \\ 0 & \hat{J}_2\end{pmatrix}\cdot\begin{pmatrix}s_1 \\ s_2\end{pmatrix} = \hat{\mathcal{P}}\cdot\begin{pmatrix}\hat{\Omega}_1 & \omega_M\hat{R}_k^{1,2} \\ \omega_M\hat{R}_k^{2,1} & \hat{\Omega}_2\end{pmatrix}\cdot\hat{\mathcal{P}}\cdot\begin{pmatrix}s_1 \\ s_2\end{pmatrix} \quad \text{Equation 4}$$

where $\omega_M = \gamma\mu_0 M_s$, $\hat{J}_i = \hat{e}\cdot\mu_i$, $\hat{e}$ is the Levi-Civita tensor, and $$\hat{\mathcal{P}} = -\begin{pmatrix}\hat{J}_1\cdot\hat{J}_1 & 0 \\ 0 & \hat{J}_2\cdot\hat{J}_2\end{pmatrix}.$$

The solution to Equation 4 is obtained with standard numerical methods obtaining values of $\omega$ and $s_i$ as a function of k.

To obtain the explicit form of tensors $\hat{N}_k$ and $\hat{R}_k^{i,j}$ we fix the coordinate system as $k=k\mathbf{x}$ and $\mathbf{y}$ is the normal to the film surface. In this coordinate system the self-demagnetization tensor is $\hat{N}_k = p\mathbf{x}\otimes\mathbf{x} + (1-p)\mathbf{y}\otimes\mathbf{y}$ with $p = (-1 + |k|L + e^{-|k|L})/(|k|L)$. The mutual demagnetization tensor is $\hat{R}_k^{1,2} = g(\mathbf{x}\otimes\mathbf{x} - \mathbf{x}\otimes\mathbf{y}) + ig\,\text{sign}(k)(\mathbf{y}\otimes\mathbf{x} + \mathbf{x}\otimes\mathbf{y})$, where $$g = \int_0^L \int_{L+d_s}^{2L+d_s} \frac{1}{2L} e^{-|k||y-y'|} dy\,dy' \quad \text{Equation 5}$$
$$= \frac{e^{-|k|(d_s+2L)}(-1+e^{|k|L})^2}{2|k|L}$$

Note that $\hat{R}_k^{1,2} = (\hat{R}_k^{2,1})^\dagger \neq (\hat{R}_{-k}^{1,2})$, which constitutes the necessary condition for spin wave nonreciprocity.

The magnetoelastic interaction couples spin waves in the magnetic film and SAWs in the substrate. This coupling leads to a modification in the dispersion characteristics of the SAWs, ultimately changing the propagation behavior. Of primary interest is the modification of losses incurred by SAWs traveling in opposite directions.

A general theory of SAW/spin wave interactions has been developed and described in R. VERBA et al., "Wide-band nonreciprocity of surface acoustic waves induced by magnetoelastic coupling with a synthetic antiferromagnet," *Phys. Rev. Appl.*, Vol. 12 (2019) 054061 and R. VERBA et al., "Nonreciprocal surface acoustic surface waves in multilayers with magnetoelastic and interfacial Dzyaloshinskii-Moriya interactions," *Phys. Rev. Appl.*, Vol. 9 (2018) 064014. Several approximations are made to render the analytical calculations manageable. First, the magnetic layer acoustically is considered to be identical to the substrate material, i.e., we do not take into account the mass loading effect. In general, mass loading is important for SAW IDT matching, however, as the mass loading is a purely mechanical effect it does not contribute to nonreciprocity. Second, the magnetoelastic coupling energy is presumed to be much smaller than other interaction energies in the system, which is practically always true for ferromagnets with strong magnetostriction.

In magnetostrictive materials, acoustic and magnetic systems are coupled via magnetoelastic interaction with characteristic energy density:

$$W^{me}(r) = \frac{b_{ijkl}u_{ij}(r)M_i(r)M_j(r)}{M_s^2} \quad \text{Equation 6}$$

where $b_{ijkl}$ is the magnetoelastic tensor and $\hat{u}$ is the mechanical strain-tensor of the SAWs. The magnetoelastic coupling is presumed to be isotropic and uniform across the ferromagnetic sample $b_{ijkl} = b\delta_{ij}\delta_{kl} + \text{sym}$. The energy density itself does depend on the direction and position in the sample.

The magnetoelastic interaction entangles SAW and spin wave modes. In the weakly coupled oscillator model, the spectrum of magnetoelastic waves can be found as:

$$\omega_k^{me} = \frac{1}{2}(\omega_k^a + \omega_k^{sw}) \pm \sqrt{\frac{(\omega_k^a + \omega_k^{sw})^2}{4} + |\kappa|^2} \quad \text{Equation 7}$$

where $\omega_k^a$ is the dispersion of the acoustic wave, $\omega_k^{sw}$ is the dispersion of the spin-wave and $\kappa$ is the inter-mode coupling coefficient. The coupling coefficient can be found as an overlap integral of the SAW and spin wave mode $$\kappa = \frac{2b}{\sqrt{A}\sqrt{Q}} \int_{-\infty}^0 \mu(y)\cdot\hat{u}^\dagger(y)\cdot s(y)dy \quad \text{Equation 8}$$

where $\dagger$ stands for Hermitian conjugation and the coefficients $\sqrt{A}$ and $\sqrt{Q}$ are the normalizing constants calculated below. In general, it is difficult to obtain useful explicit expressions for the coupling coefficient for an arbitrary configuration of the external magnetic field, magnetic anisotropy, and SAW propagation direction. Some particular cases for a bilayer magnetic film have been considered. Here, the closed form of Equation 8 is used to evaluate the integral numerically. The mechanical strain-tensor for a SAW propagating in the z-direction can be obtained as:

$$u_{zz} = e^{ik_R z}k_R^{-1}(k_R e^{\kappa_l y} + a\kappa_t e^{\kappa_t y}) \quad \text{Equation 9}$$
$$u_{yy} = -ie^{ik_R z}k_R^{-2}(\kappa_l^2 e^{\kappa_l y} + ak_R\kappa_t e^{\kappa_t y}) \quad \text{Equation 10}$$
$$u_{yz} = u_{zy} = \frac{1}{2}e^{ik_R z}k_R^{-2}(2k_R\kappa_l e^{\kappa_l y} + a(\kappa_t^2 + k_R^2)e^{\kappa_t y}) \quad \text{Equation 11}$$
$$Q = |k_R^5|\zeta\rho c_t\left(4ak_R + \frac{(k_R^2+\kappa_l)^2}{2\kappa_l} + \frac{a^2(k_R^2+\kappa_t^2)}{\kappa_t}\right) \quad \text{Equation 12}$$

where $\zeta$ is the Rayleigh coefficient, $c_t$ and $c_l$ are transverse and longitudinal velocities, $k_R = \zeta\omega/c_t$ is the Rayleigh wavenumber, $\rho$ is the density, $a = 1/2k_R/|k_R|(2-\zeta^2)/\sqrt{1-\zeta^2}$, $\kappa_t = |k_R|\sqrt{1-\zeta^2}$ and $\kappa_l = |k_R|\sqrt{1-c_t/c_l\zeta^2}$.

The magnetic part of Equation 8 can be obtained in the approximation of a uniform magnetization distribution across the film thickness. The static part is obtained by solving Equation 2 and using the following function in Equation 8:

$$\mu(y) = \mu_1\Pi_1(y) = \mu_2\Pi_2(y) \quad \text{Equation 13}$$

where $\Pi_1 = \theta(y+L) - \theta(y)$, $\Pi_2 = \theta(y+2L+d_s) - \theta(y+L+d_s)$, and $\theta(y)$ is the Heaviside step function. The dynamic part can be constructed analogously by solving Equation 4 and using the following function: $s(y) = s_1\Pi_1(y) + s_2\Pi_2(y)$. The magnetic normalizing constant A can be found from the expression:

$$A = i\frac{2LM_s}{\gamma}\sum_{j=1,2}\mu_i\cdot(s_j^\dagger \times s_j) \quad \text{Equation 14}$$

A and Q have the same dimensionality of the action linear density.

The operating principle of the magnetic SAW isolator is the direction selectivity of the SAW damping. This damping is due to the loss of energy in the magnetic system which is usually several order of magnitude larger than intrinsic SAW losses.

To take into account magnetic losses we substitute the magnetic eigenfrequency as: $\omega_k \to \omega_k + i\Gamma_k$ where the decay rate is calculated as:

$$\Gamma = \alpha_G \omega_k \frac{2LM_s}{\gamma A} \sum_{i=1,2} s_i^\dagger \cdot s^\dagger \qquad \text{Equation 15}$$

Where $\alpha_G$ is the Gilbert damping constant. The linear magnetic losses of the SAWs can be approximately calculated from Equation 7:

$$\text{Loss} \approx 4.34 \, \text{Im}(\omega^{me})/(c_R) \qquad \text{Equation 16}$$

where $c_R = \zeta c_t$ is the Rayleigh SAW velocity.

Collectively based on the above calculation, the damping caused by magnetoelastic coupling in SAWs may be calculated. The following parameters for the magnetic material are used: $\mu_0 M_s = 1.3$ T, $\gamma = 28$ GHz/T, $\alpha_G = 2 \times 10^{-2}$, $b = 9.38$ MJ/m$^3$, $L = 20$ nm, $d_s = 5$ nm, $b_a = 1.8$ mT, $\lambda_{ex} = 4.7$ nm. The elastic properties for LiNbO$_3$ are: $c_l = 2.8$ km/s, $c_t = 3.85$ km/s, $\rho = 4650$ kg/m$^3$.

First let us consider the case when the anisotropy axis is oriented at $\theta_m = 60°$ to the direction of SAW propagation. The external magnetic field is applied perpendicular to the anisotropy axis. For SAW excitation frequency $\omega/(2\pi) = 1.435$ GHz, the dependence of the losses is plotted in FIG. 3A. The inset shows the configuration of the SAW propagation, applied magnetic field and crystalline anisotropy. The maximum absorption of the SAWs happens when the SAW dispersion curve crosses the dispersion curve of spin waves. To illustrate, the SAW and spin wave dispersion are plotted for the applied magnetic field of 11 Oe (FIG. 3B). The two dispersion curves for the spin waves and SAWs cross at 1.435 GHz for the negative values of wavenumber (backward propagation), while they stay apart for forward propagation. The consequence of this crossing is the enhanced absorption of backward propagating waves.

Figure 3A:
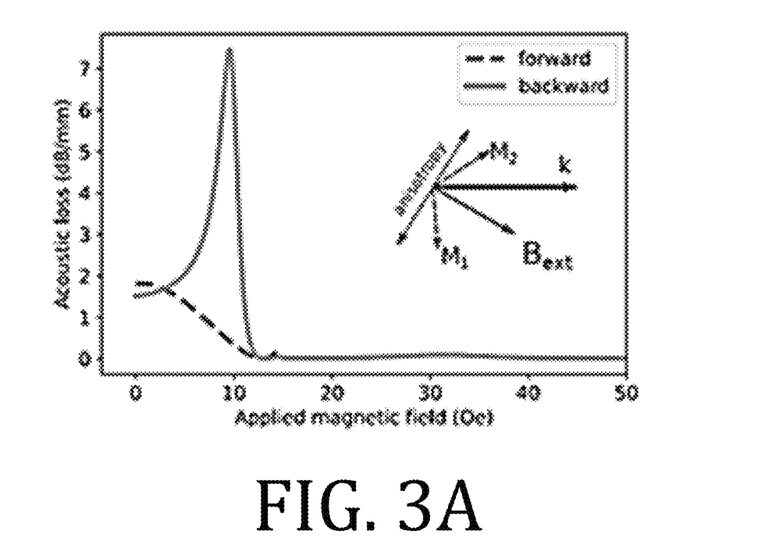
FIG. 3A is a plot for SAW excitation frequency $\omega/(2\pi)$ =1.435 GHz and the dependence of the losses.
Figure 3B:
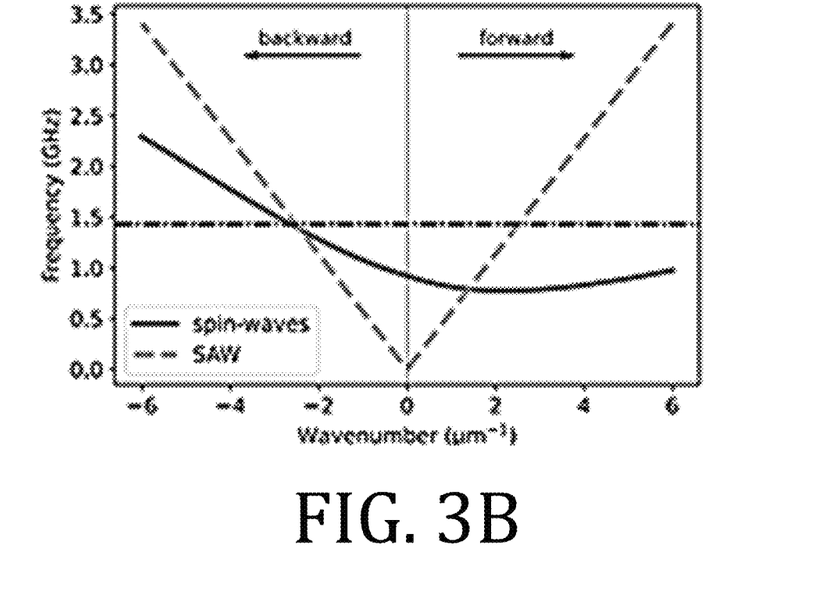
FIG. 3B is a plot of the SAW and spin wave dispersion for the applied magnetic field of 11 Oe.
Figure 3C:
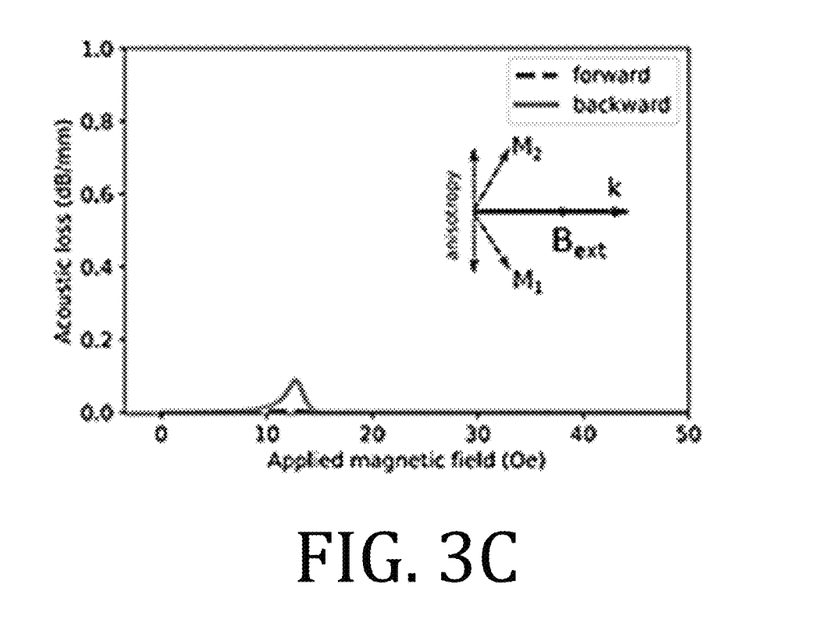
FIG. 3C shows that if the growth field is applied at 90°, the calculated isolation performance is only about 0.2 dB, nearly negligible in comparison with the 60° case.

The results in FIG. 3A show that theoretically at 10 Oe applied magnetic field, the forward loss is around 0.4 dB/mm (indicating near full transmission) whereas the backward loss is about 7.5 dB/mm. Taking the difference between forward and backward loss, 7.1 dB/mm, and multiplying by the 2.2 mm length of the multilayer stack, the calculated isolation performance is around 15.6 dB. When the growth field is applied at 90° (FIG. 3C), the calculated isolation performance is only about 0.2 dB, nearly negligible in comparison with the 60° case.

Experimentally in measurements for $\theta_m = 60°$, the difference between forward and backward propagation is the isolation performance of the device, which is remarkably high isolation of 48.4 dB. It is believed that the resonance fields are very low in these multilayer stacks, assumptions of the film properties will have strong influence on the theoretical prediction of the device performance, particularly the assumption of gyromagnetic ratio and the Gilbert damping constant. This may explain the difference between the theoretical value and our experimental result.

Nevertheless these results are particularly interesting for the development of next generation frequency-agile tunable isolator and circulator devices because of the high isolation performance. One issue to consider is the high insertion loss, which can be mitigated by advanced SAW IDT design techniques taking care to impedance match at the desired operating frequency.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Figure 4:
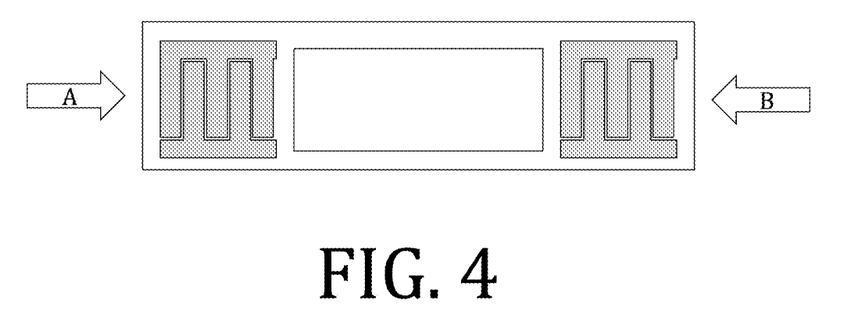
FIG. 4 is a signal generator (Keysight N5171B) delivered pulsed RF with 20 dBm power to the ADFMR device (arrow A), and the amplified output is measured using a spectrum analyzer (Keysight N9000A) (arrow B).

As an example, for evaluating the device of FIG. 1, a signal generator (Keysight N5171B) delivered pulsed RF with 20 dBm power to the ADFMR device (arrow A), and the amplified output was measured using a spectrum analyzer (Keysight N9000A) (arrow B), as shown in FIG. 4. The input power remained in the linear regime, where the characteristics of the results are not power-dependent. At higher powers, nonlinear behavior may occur. Time-gating was used to isolate the signal transmitted via SAWs, which is delayed by about 1 μs compared to the EM radiative signal because of the slower velocity of SAWs. A vector electromagnet was used to sweep the angle $\phi$ and magnitude H of the magnetizing field. The magnitude was swept from high (50 Oe) to low (0 Oe) to ensure consistency in hysteretic behavior. To measure the nonreciprocal transmission behavior of the device, the generator and analyzer were interchanged between input and output ports in two separate measurement sweeps. A vector network analyzer was used to calibrate the transmission values.

Figure 5:
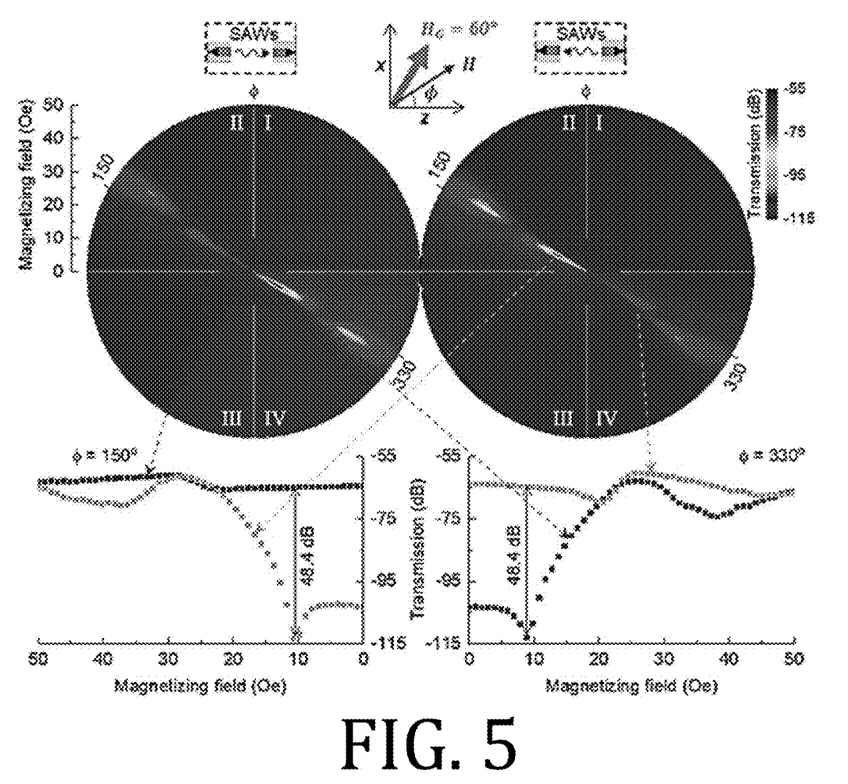
FIG. 5 shows the conventional angle-dependent magnetic field sweep versus transmission magnitude plot from the ADFMR device driven at 1435 MHz.

FIG. 5 shows the conventional angle-dependent magnetic field sweep versus transmission magnitude plot from the ADFMR device driven at 1435 MHz. Resonance field, linewidth, and contrast are quantitatively similar to that observed in a single-layer FeGaB device (not shown). Here, the growth field $H_G$ was applied at 60° relative to +z (see inset at top middle). In all prior reports of ADFMR in Ni, broad absorption resonances occurred in all four quadrants with even and odd symmetry. Notable distinctions of these measurement include: (1) breaking even symmetry, with lobes occurring only in quadrants II and IV; (2) extremely narrow line width, indicating low damping and therefore high frequency selectivity; (3) acoustic wave absorption much larger than any previously reported results; and (4) high nonreciprocity in opposite SAW travel directions.

Referring still to FIG. 5, red indicates maximum transmission (far from magnetic resonance) of approximately −55 dB. This is the insertion loss of the device and there are several known reasons for high insertion loss. Insertion loss increases with frequency due to interactions with thermally excited elastic waves and energy lost to air adjacent to the surface (air loading). In addition, operating the device at higher order harmonics and impedance mismatch also contribute to higher insertion loss, but these can be minimized through careful engineering of the IDTs which is outside the scope of the current work. In our prior work, the transmission behavior as a function of operating frequency for a similar device using Ni thin film as the ferromagnetic material.

Resonant absorption of SAWs by spin waves in the magnetic material appear as blue on the color scale, and none of this interaction was observed along the growth field axis 60° (quadrant I) and 240° (quadrant III). Interactions only exist in the perpendicular directions 150° (quadrant II) and 330° (quadrant IV). Minimum transmission was −115 dB, which occurred at H=9 Oe, $\phi=150°$ for forward propagating SAWs, and H=11 Oe, $\phi=330°$ for reverse propagating SAWs. This minimum transmission value is 60 dB lower than the insertion loss (99.9999% power absorption), which is remarkable in its own right as the highest reported ADFMR-related absorption value to date. These conditions of maximum acoustic-spin interaction are highlighted by the line cuts in the lower left plot (orange) and the lower right plot (blue). Reversing the SAW propagation direction under the same field conditions results in the other line cuts in lower left plot (blue) and the lower right plot (orange), which are nearly flat in comparison indicating almost zero interaction between the SAWs and the magnetic layer.

The isolation (i.e., the difference between forward and reverse transmission) measured at both resonant angles is 48.4 dB. This represents significantly higher isolation performance compared to state of the art commercial single stage isolator devices which are typically 18 dB to 20 dB isolation performance. Additionally the size and weight benefits are substantial compared to the state of the art. To give a perspective on the size and weight benefits, the size of commercial isolator packages range from approximately 40 mm to 75 mm, whereas the size of device according to embodiments of the present invention is less than 8 mm, which translates to about five to ten-times advantage in physical size. Similarly the weight of our integrated device package would be about 10×-20× less. There is a second resonance at higher field (H=35 Oe, φ=150°) which also exhibits significant nonreciprocity, albeit with much lower isolation than the low-field resonance.

Figure 6:
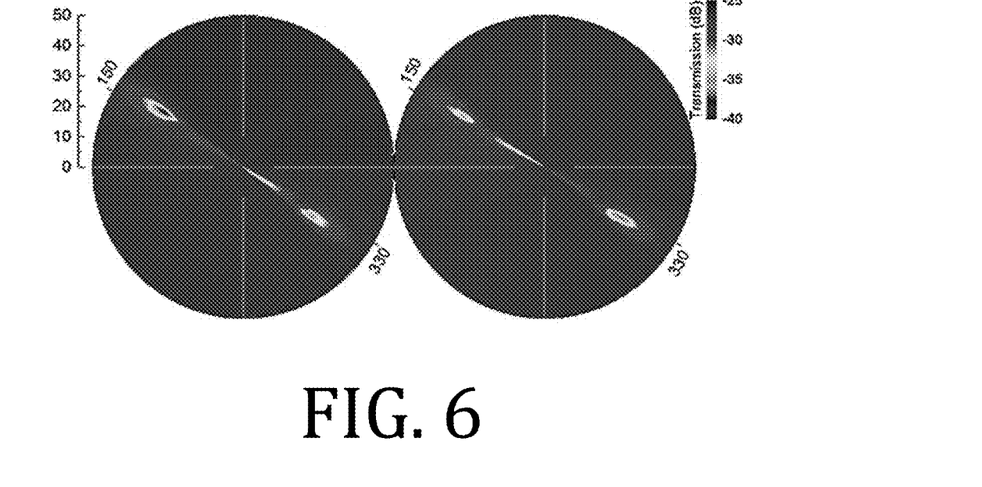
FIG. 6 illustrates that results were qualitatively similar with a driving SAW frequency of 863 MHz, but with a lower isolation of about 10 dB.

FIG. 6 illustrates that results were qualitatively similar with a driving SAW frequency of 863 MHz, but with a lower isolation of about 10 dB. Within the last year, other ADFMR studies reported isolation performance of 2 dB at 3.45 GHz, and 11 dB at 1.85 GHz.

When $H_G$=0 or 90°, the nonreciprocity minimizes or completely disappears. Here, absorption occurs at small angles from the z-axis, but along the z-axis ADFMR is prohibited because there exists no x-component for the microwave driving field produced by the Rayleigh waves, which is a necessary condition for FMR.

Figure 7:
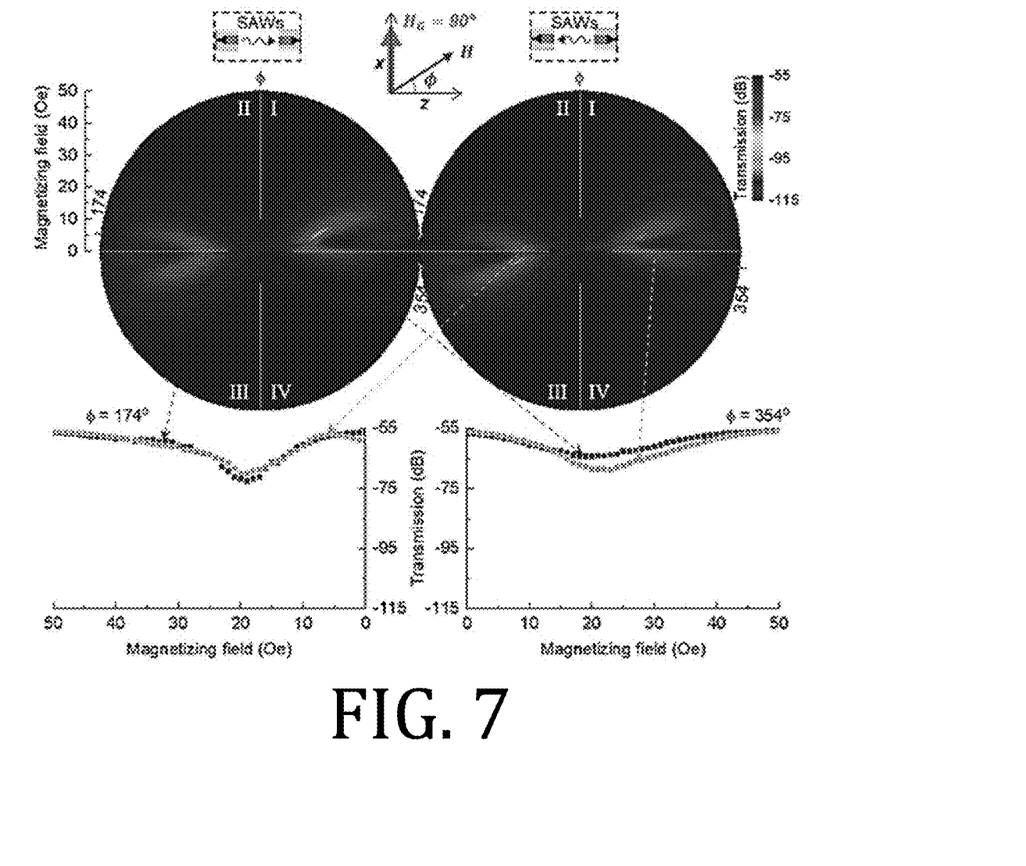
FIG. 7 show that a small nonreciprocity is observed from the line cuts (lower left and lower right).

From the line cuts (lower left and lower right) FIG. 7, a small nonreciprocity is observed. Small absorption of SAWs occurred even if the anisotropy axis was oriented non-optimally. The absorption happens because the magnetic state of the bilayers became canted under the external magnetic field and some portion the magnetoelastic driving field can interact with the magnetic material. Nonetheless, this is negligible compared to the giant nonreciprocity shown in FIG. 5. FIGS. 5 and 7 are shown on the same scale for ease of comparison.

This observed giant nonreciprocity in transmission is attributed to two primary effects. First, there is a drastic difference between the damping of oscillations in acoustic and magnetic systems. Since oscillations in a magnetic system decay very fast, even weak coupling to an acoustic system momentarily drains the energy from acoustic oscillations, i.e., when the magnetic system becomes connected to the acoustic system, acoustic waves decay at a much higher rate. Second, coupling between the two systems (spin waves and acoustic waves) is resonant. This means that for effective interaction, spin waves and acoustic waves must simultaneously have equal frequencies and wavelengths. The dispersion spectra of spin waves in bilayers is nonreciprocal, meaning that for the same frequency, spin waves propagating in the opposite directions have different wavelengths. This difference allows for effective damping of acoustic waves traveling in one direction while keeping the acoustic waves traveling in the opposite direction practically unaffected.

Figure 8:
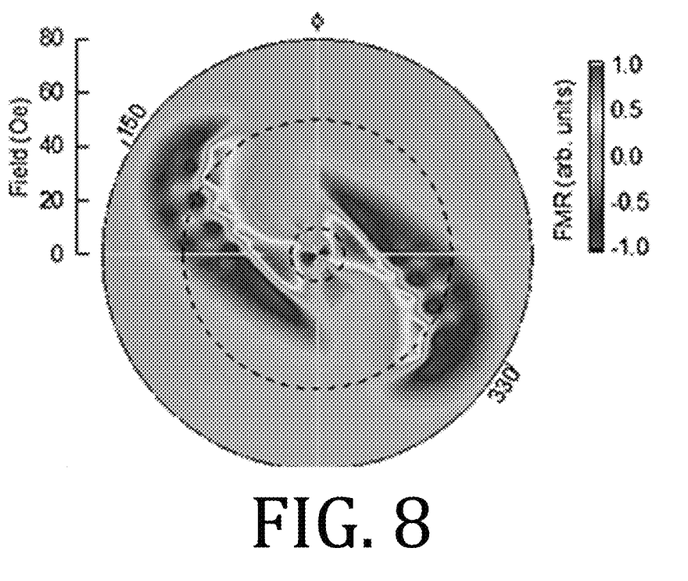
FIG. 8 illustrates ferromagnetic resonance at 2 GHz and angle-dependence of FMR showing extreme anisotropy defined by the growth field at 60 °.

FIG. 8 illustrates ferromagnetic resonance at 2 GHz. Angle-dependence of FMR showing extreme anisotropy defined by the growth field at 60°.

Figure 9:
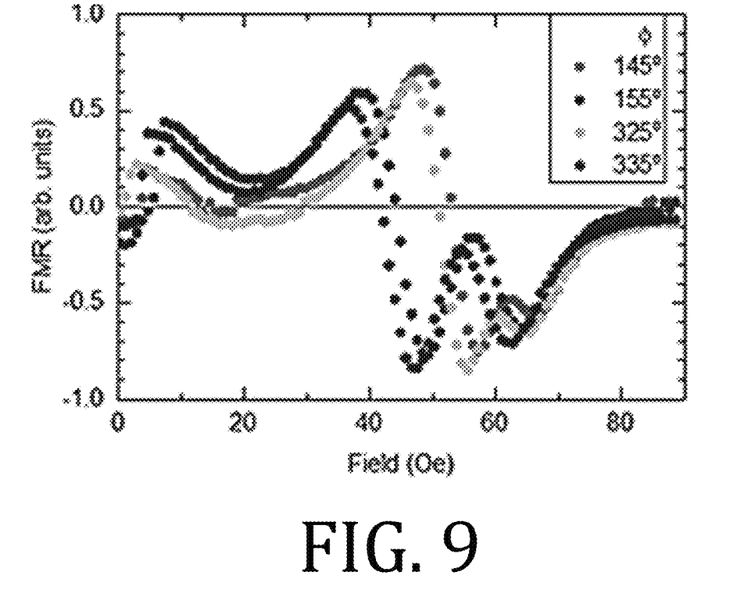
FIG. 9 includes line cuts at angles near the optimal isolator conditions.

FIG. 9 includes line cuts at angles near the optimal isolator conditions. Multiple resonances occur near 5 Oe and 45 Oe, similar to that seen in ADFMR. In FMR the uniform mode is excited, a notable difference from ADFMR in which the spin waves are traveling.

Embodiments herein describe giant nonreciprocity of surface acoustic waves through the magnetoelastic interaction and operation of a magnetoelastic magnetic field-dependent microwave isolator. A novel ferromagnetic/dielectric heterostructure in a traditional SAW delay line filter geometry is used to achieve record high RF isolation and nonreciprocal behavior. This opens a new avenue to explore next generation size, weight, and power-friendly microwave isolator and circulator devices.

Additional information is described in U.S. Pat. No. 10,601,400, entitled "Frequency tunable RF filters via a wide-band SAW-multiferroic hybrid device", which issued 24 Mar. 2020, the disclosure of which is hereby incorporated by reference in its entirety.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A nonreciprocal microwave transmission device comprising:
    a substrate;
    a transducer on a surface of the substrate and configured to reciprocally convert between electrical signals to acoustic waves;
    a first piezoelectric material configured to generates and transports acoustic waves from a signal applied to the transducer; and
    a thin film magnetic material configured to couple to acoustic waves through magnetoelastic coupling so as to have non-reciprocal magnetoelastic coupled acoustic wave transport,
    wherein transmission of acoustic waves through the thin film magnetic material in a direction toward the transducer has a first magnitude and transmission of acoustic waves through the thin film magnetic material in a direction away from the transducer has a second magnitude, the first and second magnitude being significantly different.

2. The device of claim 1, wherein the transducer comprises a first pair of split-finger interdigital transducers.

3. The device of claim 2, wherein the thin film magnetic material on the surface of the substrate is positioned proximate to the first pair of split-finger interdigital transducers such that acoustic waves emitted from the first pair of split-finger interdigital transducers are received by the thin film magnetic material.

4. The device of claim 3, further comprising:
    a second pair of split-finger interdigital transducers positioned proximate to the thin film magnetic material and opposite to the first pair of split-finger interdigital transducers such that the thin film magnetic material is positioned between the first and second pairs of split-finger interdigital transducers.

5. The device of claim 4, further comprising:
a third pair of split-finger interdigital transducers positioned proximate to the thin film magnetic material and opposite to the first and second pairs of split-finger interdigital transducers such that the thin film magnetic material is positioned between the first, second, and third pairs of split-finger interdigital transducers.

6. The device of claim 5 comprising a microwave circulator.

7. The device of claim 1, wherein the thin film magnetic material is locally patterned onto the surface of the substrate and the first piezoelectric material is conformally coated over the surface of the substrate and the thin film magnetic material.

8. The device of claim 1, wherein the substrate comprises diamond.

9. The device of claim 1, wherein the first piezoelectric material comprises a thin film coating on the surface of the substrate and the thin film magnetic material is coated on the thin film of the first piezoelectric material.

10. The device of claim 9, wherein the substrate comprises diamond.

11. The device of claim 1, wherein the substrate comprises a second piezoelectric material.

12. The device of claim 1, wherein the second piezoelectric material is selected from the group consisting of $LiNbO_3$, y-cut $LiNbO_3$, ZnO, AlN, quartz, and GaAs.

13. The device of claim 1, wherein the thin film magnetic material comprises a single magnetic material and a symmetry breaking heavy metal.

14. The device of claim 13, wherein the thin film magnetic material is platinum with a nonreciprocal acoustic wave transport.

15. The device of claim 1, the thin film magnetic material comprises a single magnetic material and a semiconductor having interfacial symmetry breaking for nonreciprocal acoustic wave transport.

16. The device of claim 1, wherein the thin film magnetic material comprises a single ferrimagnetic material with nonreciprocal magnetoelastic transport.

17. The device of claim 16, wherein the single ferrimagnetic material is a ferrite or a yttrium iron garnet.

18. The device of claim 1, wherein the thin film magnetic material comprises is composed of a single anti-ferromagnetic material with nonreciprocal magnetoelastic transport.

19. The device of claim 1, wherein the single anti-ferromagnetic material is a nickel oxide.

20. The device of claim 1, wherein the thin film magnetic material comprises a composite.

21. The device of claim 20, wherein the composite comprises a stack of alternating layers of a first material and a second material.

22. The device of claim 21, wherein the first material is magnetic and the second material is dielectric.

23. The device of claim 22, where the layers of the first material are antiferromagnetically coupled across layers of the second material.

24. The device of claim 21, wherein the first material is FeGaB and the second material is $Al_2O_3$.

25. The device of claim 24, wherein a thickness of the $Al_2O_3$ is about 70 nm.

26. The device of claim 20, wherein the composite has a thickness ranging from about 1 μm to about 10 mm.

27. The device of claim 20, wherein the composite has a width ranging from about 1 μm to about 1 mm.

28. The device of claim 2, wherein the first pair of split-finger interdigital transducers comprises an input transducer electrode and an output transducer electrode, the input transducer electrode having a width that is different from a width of the output transducer electrode, wherein differing widths of the input and output transducer electrodes provides a chirped spacing configured to control a frequency bandwidth of the device.

29. The device of claim 4, wherein spacings of the first and second pairs of split-finger interdigital transducers differ and electrodes of the first and second pairs of split-finger interdigital transducer are slanted, wherein differing spacings between the slanted electrodes is configured to control a frequency bandwidth of the device.

30. The device of claim 4, wherein spacings of the first and second pairs of split-finger interdigital transducers designed such that the acoustic waves are focused and a power density of the thin film magnetic material is high to enable non-linear behavior.

31. The device of claim 1, wherein a residual stress is applied to induce strain bias in the thin film magnetic material configured to offset a frequency of the magnetoelastic coupling.

32. The device of claim 1, further comprising:
a permanent magnet or an electromagnet configured to alter a frequency of the magnetoelastic coupling.

33. The device of claim 32, where the permanent magnet or the electromagnet is positioned at an arbitrary angle with respect to the device and is configured to alter the non-reciprocal transmission and isolation.

34. The device of claim 1, further comprising:
a pair of uniform electrodes configured to supply a low frequency electric field that alters a frequency of the magnetoelastic coupling.

35. The device of claim 34, wherein the device is switchable.

36. A split finger interdigital transducer comprising:
a y-cut $LiNbO_3$ substrate;
a first interdigital transducer on a surface of the substrate;
a second interdigital transducer on the surface of the substrate and spaced away from the first interdigital transducer; and
a multilayer thin stack on the surface of the substrate and positioned between the first and second interdigital transducers.

37. The split finger interdigital transducer of claim 36, wherein each of the first and second interdigital transducers includes 60 finger electrode pairs with an electrode separation space of $\lambda/8$.

38. The split finger interdigital transducer of claim 37, wherein the line spacing between the finger electrode pairs of the first and second interdigital transducers is 3 mm.

39. The split finger interdigital transducer of claim 36, wherein the multilayer thin stack comprises a first layer of FeGaB, a layer of $Al_2O_3$ on the first layer, and a second layer of FeGaB on the $Al_2O_3$ layer.

40. The split finger interdigital transducer of claim 39, wherein a thickness of the $Al_2O_3$ layer is 70 nm.

41. The split finger interdigital transducer of claim 36, wherein the multilayer thin stack has a length of 2200 μm and a width of 500 μm.

* * * * *